United States Patent [19]
Swanson

[11] Patent Number: 5,369,291
[45] Date of Patent: * Nov. 29, 1994

[54] VOLTAGE CONTROLLED THYRISTOR

[75] Inventor: Richard M. Swanson, Los Altos, Calif.

[73] Assignee: Sunpower Corporation, Sunnyvale, Calif.

[ * ] Notice: The portion of the term of this patent subsequent to Nov. 1, 2011 has been disclaimed.

[21] Appl. No.: 68,649

[22] Filed: May 28, 1993

Related U.S. Application Data

[63] Continuation-in-part of Ser. No. 38,401, Mar. 29, 1993.

[51] Int. Cl.$^5$ .................... H01L 29/90; H01L 29/747
[52] U.S. Cl. .................... 257/130; 257/107; 257/128; 257/497
[58] Field of Search ............... 257/107, 130, 128, 497, 257/498

[56] References Cited

U.S. PATENT DOCUMENTS

| | | | |
|---|---|---|---|
| 4,587,547 | 5/1986 | Amemiya et al. | 257/655 |
| 4,935,798 | 6/1990 | Nishizawa et al. | 257/130 |

FOREIGN PATENT DOCUMENTS 0025569 1/1990 Japan .

OTHER PUBLICATIONS

Arnould, "Dispositifs De Puissance Dipolaires Rapid A Porteurs De Duree De Vie Tres Elevee," Journees Electronique De Puissance De Futur, Bordeaux, Jun. 1-3, 1988.
Schlangenotto, "Improved Recovery of Fast Power Diodes with Self-Adjusting p Emitter Efficiency," IEEE Electron Device Letters, vol. 10, No. 7, Jul. 1989, pp. 322-324.
Shimizu, "High-Speed Low-Loss p-n Diode Having a Channel Structure," IEEE Transactions on Electron Devices, vol. ED-31, No. 9, Sep. 1984, pp. 1314-1319.
Mehrotra, "Comparison of High Voltage Power Rectifier Structures," 5th International Symposium on Power Semiconductor Devices and IC's, 0-7803-13-13-5/93/0000-0199/$3.00 ©1993 IEEE, pp. 199-204.

*Primary Examiner*—Andrew J. James
*Assistant Examiner*—Nathan K. Kelley
*Attorney, Agent, or Firm*—Townsend and Townsend Khourie and Crew

[57] ABSTRACT

A voltage controlled thyristor includes an intrinsic layer of material between an anode and a cathode and a gate region between the intrinsic layer and the cathode comprising a lightly doped P type layer with more heavily doped P type regions extending through the lightly doped layer into the intrinsic layer. The more heavily doped P type regions are interspersed among shallower N doped regions of the cathode. In a preferred embodiment, interdigitated ohmic contacts are formed on one surface to the N doped cathode regions and the P doped regions of the control gate. In a preferred embodiment, the anode and cathode emitters have a porous construction in which a lightly doped layer or region has a more heavily doped region or regions therein.

5 Claims, 1 Drawing Sheet

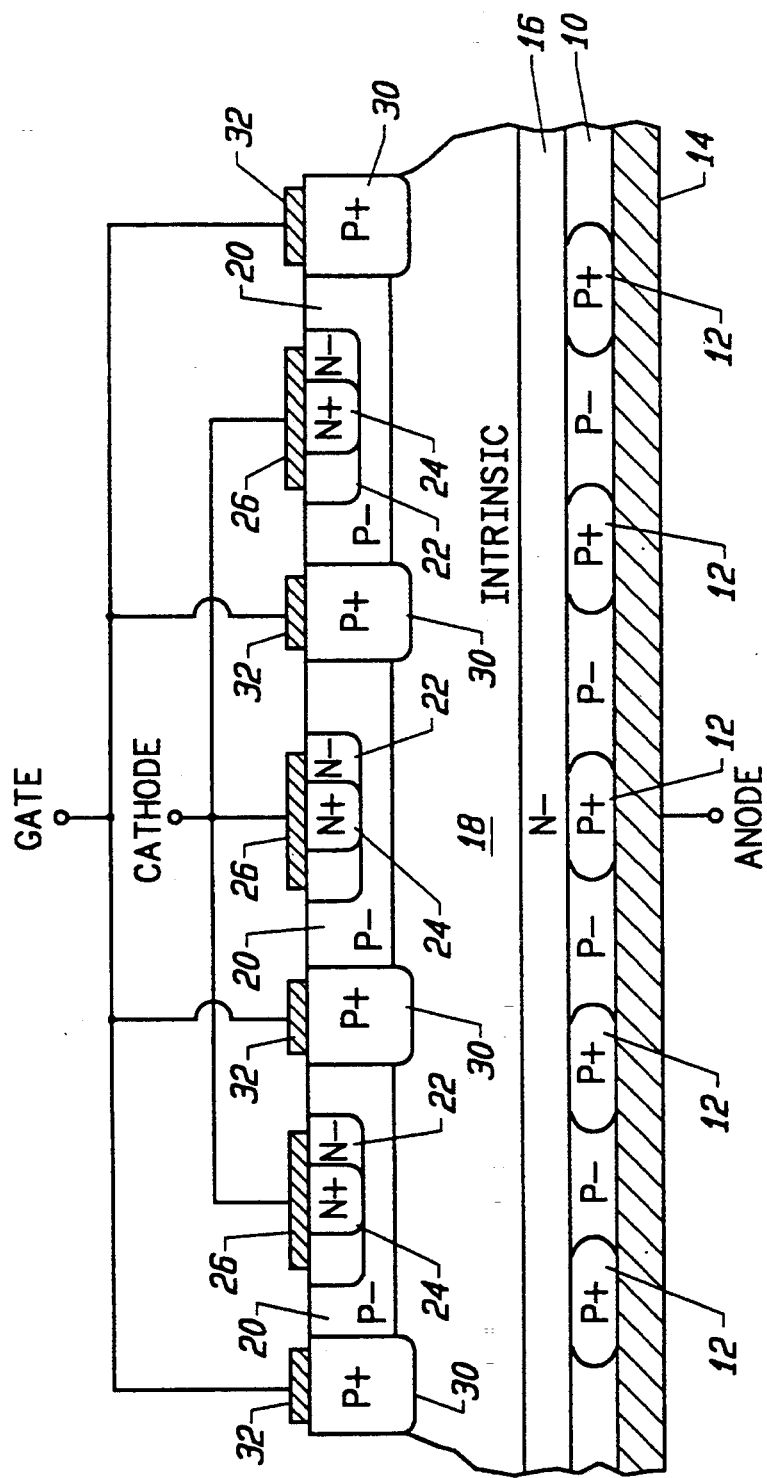

VOLTAGE CONTROLLED THYRISTOR

This application is a continuation-in-part of Ser. No. 08/038,401, filed Mar. 29, 1993, for "P/N JUNCTION DEVICE HAVING POROUS EMITTER."

BACKGROUND OF THE INVENTION

This invention relates generally to semiconductor power switching devices and, more particularly the invention relates to voltage controlled thyristor having improved switching speed and reduced drive complexity.

Until recently, the only power switching devices available in electrical power systems were bipolar transistors and thyristors. In the NPN bipolar transistor, electrons are injected from the N type emitter (cathode) across the P type base and into the N type collector (anode). In the ON state, holes flow from the base throughout the device and thus the lightly doped collector is conductivity modulated. This results in a lower voltage drop than would otherwise result. The increased charge thus stored results in a long turnoff delay.

The thyristor is a four layer diode having very high current handling capability because carriers are injected from both the cathode and anode. This is called double injection and results in better conductivity modulation than in the bipolar junction transistor where carriers are injected from only one side. The thyristor is much more tolerant of surge current than the bipolar junction transistor and virtually immune to the second breakdown effects which plague high power bipolar transistors. Standard thyristors have a relatively simple structure because they do not need the interdigitated base contact structure in order to provide base drive current, such current comes from the holes injected from the anode.

Standard thyristors cannot be turned off without interrupting the current flow. This is done either by relying on the natural reversal of current direction in an AC circuit or by providing separate and expensive self-commutating circuits. If the gate contact is highly interdigitated, as in a bipolar transistor, and of sufficiently low resistance, the device can be turned off by diverting enough current from the gate to remove the forward bias of the cathode-base junction. In this case, the device is called a gate turnoff thyristor (GTO). A GTO requires high gate currents during turnoff, typically 20-50% of the anode current, and are more expensive than comparably rated thyristors.

In the metal-oxide-silicon transistor (MOST) electrons are ejected from the cathode to anode along a field induced channel. There is no minority carry injection and storage, thus the MOST is very fast. MOST devices now dominate the market for switching power supplies and motor controls for applications below 200 volts and 100 amperes.

The insulated gate bipolar transistor (IGBT) is a hybrid MOS/bipolar combination device which provides higher current capability while at the same time retaining the attractive features of the MOST. See U.S. Pat. No. RE 33,209, for example. The IGBT is a thyristor in which the cathode and P-type base are shorted, and the gate electrode is provided to induce a channel from cathode to the N type base region. It is similar to the MOST with a P type region added to the anode. Thyristor action is discouraged by the short; however, holes will be injected from the anode to conductivity modulate the base as in a thyristor. The device has much higher current capability than the MOST; however, because the region near the front of the cathode is not conductivity modulated by virtue of the cathode-base short, the current handling capability is less than that of the GTO.

Another structure designed to realize the high current capability of the thyristor in an MOS controlled device is the MOS controlled thyristor (MCT) which uses a P channel MOST between the cathode and P base and which can turn the device off in the manner of a GTO. However, in the MCT the high turnoff current of the GTO gate flows internally through the MOST and the external circuit need only provide for charging the capacitance of the gate. A similar device is the field controlled thyristor in which the MOS transistor of the MCT is replaced by a vertical junction field effect transistor (JFET). Choice of turnoff transistor type makes little difference on device performance; however the drive circuit on JFET versions must supply high currents as in the case of the GTO.

The present invention is directed to an improved power switching device particularly applicable in high power pulse width modulation power supplies and having improved switching speed and high standoff voltage in the OFF state.

SUMMARY OF THE INVENTION

In accordance with the invention a new voltage controlled thyristor device is provided in which a PNPN thyristor structure includes an intermediate intrinsic semiconductor standoff region having sufficient thickness to handle the device OFF voltage. The P doped gate region includes lighter P− doped regions abutting shallow heavily doped N+ cathode regions to limit stored charge for fast switching speed. Heavier doped P+ regions of the gate are interspersed among the shallow N+ cathode regions and extend into the intrinsic region to divert current from the cathode and remove the forward bias of the P gate and cathode junction during the device turnoff. The P− doped gate region provides a high turnoff gain in the blocking state and reduces the requirement for overlap of the carrier depletion regions of the gate around the N+ cathode regions. Thus, spacing of the P+ gate regions and the N+ cathode regions is less critical than in conventional gate turnoff thyristors.

In a preferred embodiment, the porous emitter structures disclosed in copending application Ser. No. 08/038,401, supra, are employed in both the anode and the cathode of the voltage controlled thyristor to increase saturation current and reduce stored charge. Each carrier emitter comprises a lightly doped region with one or more heavily doped regions of the same conductivity type therein and extending to a surface and to an overlying contact. The more heavily doped regions reduce contact resistance while the more lightly doped region controls injected charge.

The invention and objects and features thereof will be more readily apparent from the following detailed description and appended claims when taken with the drawing.

BRIEF DESCRIPTION OF THE DRAWING

The drawing is a section view of a voltage controlled thyristor in accordance with one embodiment of the invention.

DESCRIPTION OF ILLUSTRATIVE EMBODIMENT

Referring now to the drawing, shown is a section view of a voltage controlled thyristor in accordance with one embodiment of the invention. The device comprises a monocrystalline silicon body having two opposing surfaces in which the anode and cathode, respectively, of the device are formed. The anode comprises a P− doped layer 10 with a plurality of P+ regions 12 formed therein. A layer 14 of contact material such as aluminum is formed on the surface in ohmic contact with the P− layer 10 and the P+ regions 12. An N-doped layer 16 separates the anode from an intrinsic semiconductor body region 18. The intrinsic body region can be lightly doped with N-type dopants.

The control gate comprises a P− layer 20 in which the cathode regions of the device are formed. Each cathode region includes an N− doped region 22 formed in the P− region 20 with an N+ region 24 formed in the N− region 22. In this embodiment the regions 22, 24 of the cathode, as well as the P+ regions 12 in P− layer 10 of the anode, comprise porous emitter structures such as disclosed in the application Ser. No. 08/038,401, supra. Ohmic contacts 26 of aluminum, for example, contact the cathode regions 22, 24.

The control gate structure in the voltage controlled thyristor comprises the P− region 20 and deep P+ diffused regions 30 which extend from the surface of the device through the layer 20 into the intrinsic body portion 18. The P+ doped regions 30 are dispersed among the cathode regions with adjacent cathode regions separated by a P+ region 30. In a plan view, the P+ regions 30 are elongated regions interconnected by elongated contacts 32 which are interdigitated with the elongated contacts 26 of the cathode regions. The gate and cathode interdigitated contacts can include two level solder bump metalization to allow for low gate resistance.

The intrinsic body region 18 provides a high lifetime voltage standoff region with sufficient thickness to handle the OFF voltage of the device. The porous cathode and anode emitter structures keep stored charge to a minimum required for low ON voltage with very low doping densities present in the P− and N− bases 16, 20.

In operation, a positive voltage on the control gate relative to the cathode renders the device conductive. For turnoff, the gate bias voltage becomes negative with respect to the cathode, and drive current is diverted to the deep P+ regions 30 of the control gate.

A charge control analysis of the voltage controlled thyristor follows. The main results of this analysis are presented below. If we define the following parameters: $J_A$ is the anode current density, $J_{ne}$ is the saturation current density of the n-emitter (cathode), $J_{pe}$ is the saturation current density of the p-emitter (anode), $\beta_A$ is the current gain of the anode transistor (p-emitter to n-base) and $\beta_C$ is the current gain of the cathode transistor (n-emitter to p-base), $J_G$ is the gate current, $n_b$ is the carrier density in the stand-off region, $n_i$ is the intrinsic carrier density, and $Q_B = qn_b W$ is the stored charge, then $$J_A = \left[ J_{ne} \frac{\beta_C(\beta_A + 1)}{\beta_A \beta_C - 1} + J_{pe} \frac{\beta_A(\beta_C + 1)}{\beta_A \beta_C - 1} \right] \frac{n_b^2}{n_i^2} -$$

$$J_G \frac{\beta_C(\beta_A + 1)}{\beta_A \beta_C - 1} + \frac{(\beta_A + 1)(\beta_C + 1)}{\beta_A \beta_C - 1} \frac{dQ_B}{dt}$$

To have thyristor action it is necessary that $\beta_A \beta_C > 1$.

The on-voltage, $V_{on}$, is given by $$V_{on} = \frac{kT}{q} \ln\left(\frac{n_b^2}{n_i^2}\right) + \frac{JW}{q(\mu_n + \mu_p)n_b} +$$

$$\frac{kT}{q} \ln\left[\frac{\beta_A \beta_C + \beta_A J_{pe}/J_{ne}}{\beta_A \beta_C - 1}\right] +$$

$$\frac{kT}{q} \ln\left[\frac{\beta_A \beta_C + \beta_C J_{ne}/J_{pe}}{\beta_A \beta_C - 1}\right].$$

The first term represents the separation of quasi-Fermi levels in the stand-off region, the second term comes from stand-off region potential drop, and the last two terms come from quasi-Fermi level drops in the n- and p-bases.

The turn-off charge-control storage time (roughly the total turn-off time) is given by $$T_{stor} = \frac{qWn_b}{J_A} \frac{(\beta_A + 1)(\beta_C + 1)}{(\beta_A \beta_C - 1)} \sqrt{\frac{K/K_{max}}{1 - K/K_{max}}} \tan^{-1}\sqrt{\frac{K/K_{max}}{1 - K/K_{max}}}$$

where $K = J_A/J_G$ is the turn-off gain and $$K_{max} = \frac{\beta_C(\beta_A + 1)}{\beta_A \beta_C - 1}$$

is the maximum turn-off gain. At greater gains (i.e., less gate current) the device will not turn-off.

The storage time increases dramatically with increase in gain (decrease in gate current). This is illustrated in the following table where we have assumed that $\beta_A = 0.5$ and $\beta_C = 8$ (see discussion below). This gives $K_{max} = 4$.

| K | $T_{stor}/qWn_b/J_A$ |
|---|---|
| 4 | ∞ |
| 3 | 8.16 |
| 2 | 3.53 |
| 1 | 1.36 |

An advantage of operating the GTO in a cascode circuit (where $K=1$) compared with a more conventional circuit operating at perhaps $K=2$ is over a two-fold decrease in storage time.

If $K=1$ then the argument of the inverse tangent in the above equation will be small and the equation simplifies to the more transparent form, $$T_{stor} = \frac{qWn_b}{J_A}(1 + \beta_A).$$

The storage time is enhanced over that of a simple diode because the anode injects an additional charge of fraction $\beta_A$. This equation is the same as for the storage time of pnp transistor when it is switched off in the open-base configuration. This is expected, as that is what the GTO is when turned off at unity gain (i.e., the n-emitter is disconnected and the p-base becomes like the collector of a pnp transistor). Clearly, for fast switching, $\beta_A$ must be small, typically 0.5 or so.

The ratio of electron and hole currents is given by $$\frac{J_n}{J_p} = \frac{J_{pe} + J_{ne}/\beta_A}{J_{ne} + J_{pe}/\beta_C}.$$

We are now in a position to select the diffusion profiles and design the device. After some consideration, it has been found that good choices for $\beta_A$ and $\beta_C$ are $\beta_A = 0.5$ and $\beta_C = 8$. This gives a loop gain of 4. In the steady-state on-condition we have from above, $$J_A = (4J_{ne} + 1.5J_{pe})\frac{n_b^2}{n_i^2}.$$

We see that the presence of the bases enhances the current over that of a simple pin diode. The ratio of currents is $$\frac{J_n}{J_p} = \frac{J_{pe} + J_{ne}/0.5}{J_{ne} + J_{pe}/8}.$$

Suppose we want to have $n_b = 2.5 \times 10^{16}$ cm$^{-3}$ at 200 A/cm$^2$. The stand-off region width will be 100 $\mu$m, which gives a comfortable breakdown voltage of 1600 V. The storage time in a cascode circuit is then $$T_{stor} = \frac{qWn_b}{J_A}(1 + \beta_A) = 300 \text{ ns}.$$

From above we get $$4J_{ne} + 1.5J_{pe} = 7 \times 10^{-11} A/cm^2.$$

Also, requiring that $J_n = (\mu_n/\mu_p)J_p$ gives $$\mu_n/\mu_p = 3 = \frac{J_{pe} + J_{ne}/0.5}{J_{ne} + J_{pe}/8}.$$

The above two equations can be solved for $J_n$ and $J_p$ giving $$J_{ne} = 1.09 \times 10^{-11} A/cm^2,$$

$$J_{pe} = 1.74 \times 10^{-11} A/cm^2$$

We can now calculate the base region saturation currents using the relations for the beta of the cathode and anode regions $$\beta_A = \frac{J_{nb}}{J_{pe}}$$

$$\beta_C = \frac{J_{pb}}{J_{ne}}$$

where $J_{nb}$ is the n-base saturation current and $J_{pb}$ is the p-base saturation current. This gives $$J_{nb} = 0.86 \times 10^{-11} A/cm^2,$$

$$J_{pb} = 8.72 \times 10^{-11} A/cm^2.$$

These saturation currents can be obtained with the following profiles. $N_S$ is the surface concentration. The junction depth is $x_j$ and the sheet resistance is $\rho_\square$. In the case of the bases, $x_j$, the intrinsic base width and $\rho_\square$ the intrinsic, or pinch-base sheet resistance.

| region | $N_s$ (cm$^{-3}$) | $x_j$ ($\mu$m) | $\rho_\square$ ($\Omega/\square$) |
|---|---|---|---|
| n-emitter | $1 \times 10^{18}$ | 1 | 500 |
| p-base | $1 \times 10^{17}$ | 1 | 5000 |
| n-base | $1 \times 10^{18}$ | 1 | 500 |
| p-emitter | $3 \times 10^{17}$ | 1 | 2000 |

These profiles are approximate and meant to be illustrative. The exact profiles which give the desired saturation currents will be found by detailed modeling and experimentation.

We are now in a position to calculate the on-voltage. Using the above formula for $V_{on}$ we get $V_{on} = 1.06$ V in the actual device. If we assume an additional 0.2 V drop in the metal, we get a total drop of 1.25 V.

Collecting these results all together in one place we get the projected performance for the VCT when switched in a cascode circuit that is shown in the following table:

| parameter | specification |
|---|---|
| breakdown voltage | 1600 V |
| current density | 200 A/cm$^2$ |
| on-voltage | 1.26 V |
| switching time | 300 ns |

There has been described a voltage controlled thyristor which is readily fabricated and in which switching speed is increased due to reduced charge controlled storage time. While the invention has been described with reference to a specific embodiment, the description is illustrative of the invention and is not to be construed to be limiting the invention. Various modifications and applications may occur to those skilled in the art without departing from the true spirit and scope of the invention as defined by the appended claims.

What is claimed is:

1. A voltage controlled thyristor comprising
a semiconductor body having first and second major opposing surfaces and an intrinsic body region therebetween,
a first layer of semiconductor material abutting said first surface, said first layer including P type dopants of a first concentration,
a first plurality of P type doped regions in said first layer having dopant of a second concentration greater than said first concentration, said second concentration being on the order of $3 \times 10^{17}$ dopant atoms per cm$^3$;
a second layer of semiconductor material between said intrinsic body region and said first layer of semiconductor material, said second layer including N type dopant of a third concentration, said third concentration being on the order of $1 \times 10^{18}$ dopant atoms per cm$^3$;
a third layer of semiconductor material abutting said second surface and said intrinsic body region, said third layer including P type dopants of a fourth concentration, said fourth concentration being on the order of $1 \times 10^{17}$ dopant atoms per cm$^3$;

a first plurality of N type doped regions in said third layer having dopant of a fifth concentration, a second plurality of N type doped regions in said first plurality of N type doped regions having dopant of a sixth concentration greater than said fifth concentration, said sixth concentration being on the order of $1 \times 10^{18}$ dopant atoms per $cm^3$ a second plurality of P type doped regions extending from said second surface through said third layer into said intrinsic body region, said second plurality of P type doped regions being interspersed among said first plurality of N type doped regions and having a dopant concentration greater than said fourth concentration, said first layer and said first plurality of P type doped regions comprising an anode, said first plurality of N doped regions and said second plurality of N doped regions comprising a cathode, and said third layer and said second plurality of P type doped regions comprising a control gate.

2. The voltage controlled thyristor as defined by claim 1 wherein said semiconductor body comprises monocrystalline silicon.

3. The voltage controlled thyristor as defined by claim 1 and further including an ohmic contact on said first surface to said anode, an ohmic contact on said second surface to said cathode, and an ohmic contact on said second surface to said control gate.

4. The voltage controlled thyristor as defined by claim 3 wherein said ohmic contact to said cathode and said ohmic contact to said control gate are interdigitated.

5. The voltage controlled thyristor as defined by claim 4 wherein said semiconductor body comprises monocrystalline silicon.

* * * * *